(12) United States Patent
Lyu et al.

(10) Patent No.: US 6,537,843 B2
(45) Date of Patent: Mar. 25, 2003

(54) THIN FILM TRANSISTOR AND METHOD OF MANUFACTURING THE SAME

(75) Inventors: Ki-Hyun Lyu, Kyongki-do (KR); Kwang-Jo Hwang, Kyongki-do (KR)

(73) Assignee: LG.Philips LCD Co., LTD, Seoul (KR)

( * ) Notice: Subject to any disclaimer, the term of this patent is extended or adjusted under 35 U.S.C. 154(b) by 0 days.

(21) Appl. No.: 09/978,050

(22) Filed: Oct. 17, 2001

(65) Prior Publication Data

US 2002/0017665 A1 Feb. 14, 2002

Related U.S. Application Data

(62) Division of application No. 08/979,843, filed on Nov. 26, 1997, now Pat. No. 6,329,672.

(30) Foreign Application Priority Data

Dec. 6, 1996 (KR) .............................. 96-62231

(51) Int. Cl.[7] .............................................. H01L 21/00
(52) U.S. Cl. ................... 438/48; 438/149; 438/157; 438/159; 438/160; 438/585; 438/592; 257/213; 257/288; 257/296; 257/347; 257/412; 257/413
(58) Field of Search ................... 438/149, 157, 438/48, 159, 160, 585, 592; 257/288, 213, 296, 347, 412, 413

(56) References Cited

U.S. PATENT DOCUMENTS 5,010,027 A    4/1991  Possin et al. ................ 437/41
5,162,933 A  * 11/1992  Kakuda et al. ............... 359/99
5,240,868 A  *  8/1993  Bae et al. ..................... 438/591
5,430,320 A     7/1995  Lee .............................. 257/412
5,592,008 A     1/1997  Yamazaki et al. ........... 257/347
5,612,234 A  *  3/1997  Ha ............................... 438/163
5,789,761 A     8/1998  Ihara et al. ................... 257/59
5,812,231 A     9/1998  Kochi et al. ................. 349/151
5,814,529 A     9/1998  Zhang ......................... 438/30

FOREIGN PATENT DOCUMENTS

JP    04291959 A    10/1992
JP    05110092 A     4/1993
JP    05110094 A     4/1993
JP    05275697 A    10/1993

* cited by examiner

Primary Examiner—Matthew Smith
Assistant Examiner—Belur Keshavan
(74) Attorney, Agent, or Firm—Morgan, Lewis & Bockius LLP

(57) ABSTRACT

A thin film transistor is disclosed, including an insulating substrate, a semiconductor layer formed on the insulating substrate, the semiconductor layer having an active region and an impurity region, a gate insulating layer formed on the active region of the semiconductor layer, a first gate metal layer formed on a predetermined portion of the active region of the semiconductor layer to define a channel region, and a second gate metal layer formed on the first gate metal layer. The first and second gate metal layers have different compositions, such that the second gate metal layer etches faster than the first gate metal layer, thereby preventing formation of a hillock. A first protective layer is formed over the structure, then a light shielding layer, and then a second protective layer is formed over the light shielding layer.

12 Claims, 5 Drawing Sheets

THIN FILM TRANSISTOR AND METHOD OF MANUFACTURING THE SAME

This is a divisional of application Ser. No. 08/979,843 filed on Nov. 26, 1997, now U.S. Pat. No. 6,329,672.

This application claims the benefit of Korean patent application No. 96-62231, filed Dec. 6, 1996, which is hereby incorporated by reference.

BACKGROUND OF THE INVENTION

1. Field of the Invention

The present invention relates to a thin film transistor of an active matrix liquid crystal display device and a method of manufacturing the same, and, more particularly, to a thin film transistor having a double gate layer and a method of manufacturing the same.

2. Discussion of the Related Art

In general, a thin film transistor (TFT) using amorphous silicon has an advantage in that a thin film semiconductor layer is formed on a glass substrate by a low-temperature process, and no leakage current is generated in the OFF state due to a wide energy band gap and a high resistance of the thin film itself. However, because the charge carrier mobility in the amorphous silicon of the thin film transistor is low, its current characteristic in the ON state is poor compared to a single-crystal or polycrystalline transistor. Moreover, the amorphous silicon thin film transistor does not employ a driving circuit on the same substrate.

A thin film transistor using polysilicon has higher charge carrier mobility and lower resistance than a thin film transistor using amorphous silicon, thus driving a large current in the ON state and forming a driving circuit with pixels on the same substrate. However, because the polysilicon thin film transistor has a narrow energy band gap and numerous Si dangling bonds, a large leakage current is generated around the drain region.

Therefore, a thin film transistor was developed having a LDD (lightly doped drain) region, or an offset region, to decrease the leakage current.

FIG. 1 is a sectional view of a conventional TFT. A buffer oxide layer 13 is formed on a transparent insulating substrate 11, and a semiconductor layer 15 is formed on a predetermined portion on the buffer oxide layer 13. A gate oxide layer 17 is formed on a predetermined portion on the semiconductor layer 15. A gate 19a is formed on a predetermined portion of the gate oxide layer 17.

The semiconductor layer 15 includes an active region 15a with no impurity doping, and an impurity region 15b where N type or P type impurities are highly doped to be used for the source and drain regions. The active region 15a consists of a channel region C1 where a channel is formed under the gate 19a, and an offset region O1 between the channel region C1 and an impurity region 15b.

An aluminum gate 19a is formed overlapping the channel region C1 of the active region 15a. Anode oxide layers 21 and 27 are formed on the surface of the gate 19a.

In the TFT described above, when a voltage is applied to the gate 19a, a channel is formed in the offset region O1 as well as in the channel region C1 due to an electric field, thereby turning the TFT on. When no voltage is applied to the gate 19a, no electric field is applied to the offset region O1, thereby preventing any leakage current.

FIGS. 2A–2D show the manufacturing process of the TFT. Referring to FIG. 2A, the buffer oxide layer 13 is formed on the transparent insulating substrate 11. The semiconductor layer 15 is formed on the buffer oxide layer 13 by depositing polysilicon. The semiconductor layer is patterned by a typical photolithography process to expose a predetermined region of the buffer oxide layer 13.

Referring to FIG. 2B, the gate oxide layer 17 is formed covering the buffer oxide layer 13 and the semiconductor layer 15. A gate metal layer 19 is formed by depositing an anode-oxidative metal such as aluminum, and the surface of the gate metal layer 19 is anodized to form a first anode oxide layer 21.

Referring to FIG. 2C, a photoresist pattern 23 is formed on a portion of the first anode-oxide layer 21. The first oxide layer 21 and the gate metal layer 19 are anisotropically etched using the photoresist pattern 23 as a mask. A part of the gate metal layer 19 that is not etched and removed becomes the gate 19a. The second anode oxide layer 25 is formed by anodizing the lateral sides of the gate 19a. The second anode-oxide layer 25 is anodized in a horizontal direction to define the offset region O1. In the anodizing process, large current flows to the gate 19a to speed up the anodizing of the gate 19a. As a result, the second anode oxide layer 25 is porous.

Referring to FIG. 2D, the gate oxide layer 17 is anisotropically etched using the photoresist layer 23 as a mask to expose a predetermined portion of the semiconductor layer 15 and the buffer oxide layer 13. The photoresist pattern 23 is then eliminated. Next, a third anode-oxide layer 27 is formed between the lateral side of the gate 19a and the second anode-oxide layer 25. Here, an electrolyte liquid makes contact with the lateral side of the gate 19a through the second porous anode-oxide layer 25 and therefore the third anode-oxide layer 27 is formed by anodizing the gate 19a. The second anode-oxide layer 25 is etched away, while the first and third anode oxide layers 21 and 27, which are denser than the second anode oxide layer 25, remain during the etching process. The second anode oxide layer 25 is removed entirely. Thus, the third anode-oxide layer 27 remains on the lateral side of the gate 19a. Thereafter, N type or P type impurities are highly doped into exposed portions of the semiconductor layer 15, using the first anode oxide layer 21 and the gate oxide layer 17 as a mask, thus forming source and drain regions 15b. Here, the remaining portion of the semiconductor layer 15 is the active region 15a. In this active region 15a, the portion overlapping the gate 19a becomes the channel region C1, while the portion between the impurity region 15b and the channel region C1 is the offset region O1.

As described above, in the conventional TFT the gate metal layer is patterned using the photoresist pattern 23 as a mask to form the gate 19a, the lateral sides of the gate 19a are anodized at a high rate without eliminating the photoresist pattern in order to form a second porous anode-oxide layer 25 in a horizontal direction, the photoresist pattern 23 is eliminated, and the portion between the lateral side of the gate and the second anode-oxide layer 23 is anodized to form the third anode-oxide layer. The third anode oxide layer 27 defines the offset region O1.

The conventional process for forming a TFT has certain drawbacks because it requires a complicated process to eliminate the lateral side of the gate 19a after the anodizing in the horizontal direction in order to define the offset region O1. Also, a hillock is generated due to the gate 19a consisting of Al.

SUMMARY OF THE INVENTION

Accordingly, the present invention is directed to a thin film transistor and method of manufacturing the same that substantially obviates one or more of the problems due to the limitations and disadvantages of the related art.

An object of the present invention is to provide a thin film transistor that does not have a hillock due to a gate.

Another object of the present invention is to provide a method for manufacturing a thin film transistor which can reduce the number of the processes by facilitating the definition of the offset region.

Additional features and advantages of the present invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, in a first aspect of the present invention there is provided a thin film transistor including an insulating substrate, a semiconductor layer formed on the insulating substrate and having an active region and an impurity region, a gate insulating layer formed on the active region of the semiconductor layer, a first gate metal layer formed on a portion of the active region of the semiconductor layer defining a channel region, and a second gate metal layer formed on the first gate metal layer.

In a second aspect of the present invention there is provided a method for manufacturing a thin film transistor, including the steps of forming a semiconductor layer on an insulating substrate, wherein the semiconductor layer has no impurity doping, depositing a gate insulating layer, a first gate metal layer and a second gate metal layer on the semiconductor layer, forming a photoresist pattern on a portion on the second gate metal layer, the photoresist pattern overlapping the portion of the semiconductor layer, and etching the first and second gate metal layers using the photoresist pattern as a mask to expose both sides of the first gate metal layer to form exposed portions of the first gate metal layer, wherein the second gate metal layer etches faster than the first gate metal layer.

In a third aspect of the present invention there is provided a method of manufacturing a thin film transistor, including the steps of forming a semiconductor layer on an insulating substrate, depositing a gate insulating layer, a first gate metal layer and a second gate metal layer on the semiconductor layer, forming a photoresist pattern on a portion of the second gate metal layer, the photoresist pattern overlapping a predetermined portion of the semiconductor layer, etching the first and second gate metal layers using the photoresist pattern as a mask to expose both sides of the first gate metal layer to form an exposed portion of the first gate metal layer, wherein the second gate metal layer etches faster than the first gate metal layer, anodizing the exposed portion of the first gate metal layer to form spacers, removing the photoresist pattern, forming impurity regions by doping impurities into exposed portions of the semiconductor layer, forming an insulating interlayer, removing a portion of the insulating interlayer to form contact holes exposing the impurity regions, forming source and drain electrodes making contact with the impurity regions through the contact holes, forming a first protective layer on the insulating interlayer and the source and drain electrodes, forming a light shielding layer covering a portion excluding a pixel region on the first protective layer, forming a second protective layer on the first insulating layer and light shielding layer, removing a portion of the first and second protective layers to form a contact hole exposing the drain electrode, and forming a pixel electrode on the second protective layer of the pixel region in contact with the drain electrode through the contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
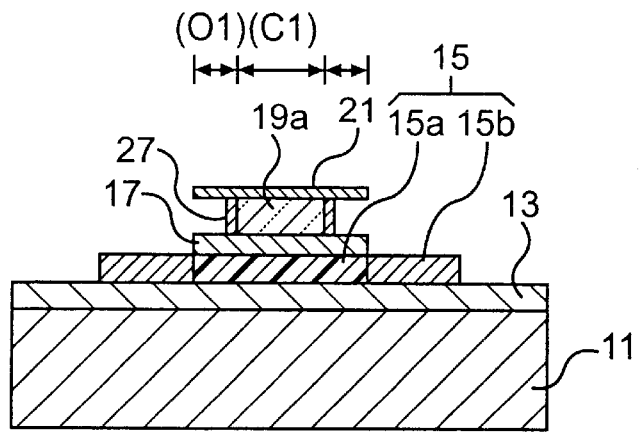
FIG. 1 is a sectional view of a conventional thin film transistor.
Figure 2A:
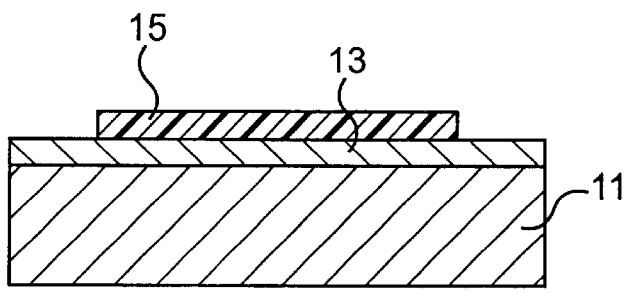
FIGS. 2A–2D illustrate a conventional process for manufacturing the thin film transistor of FIG. 1.
Figure 2B:
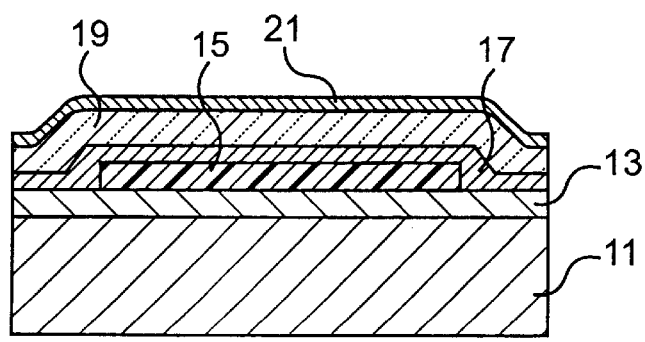
Figure 2C:
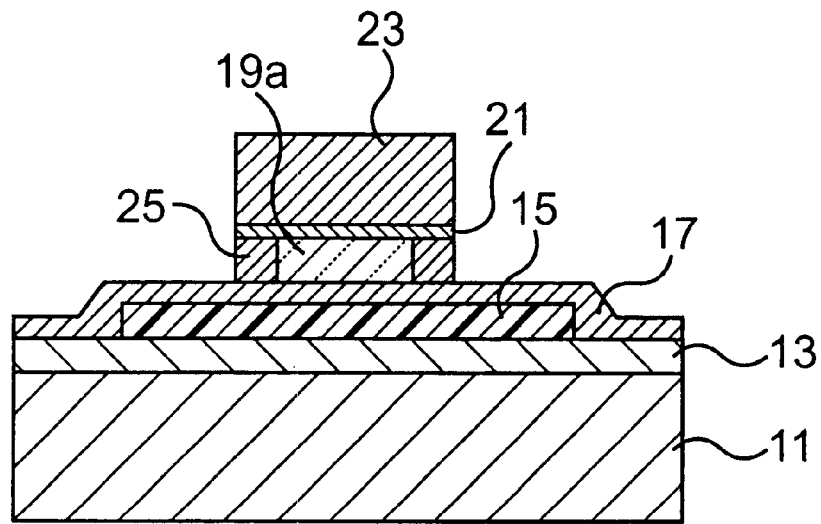
Figure 2D:
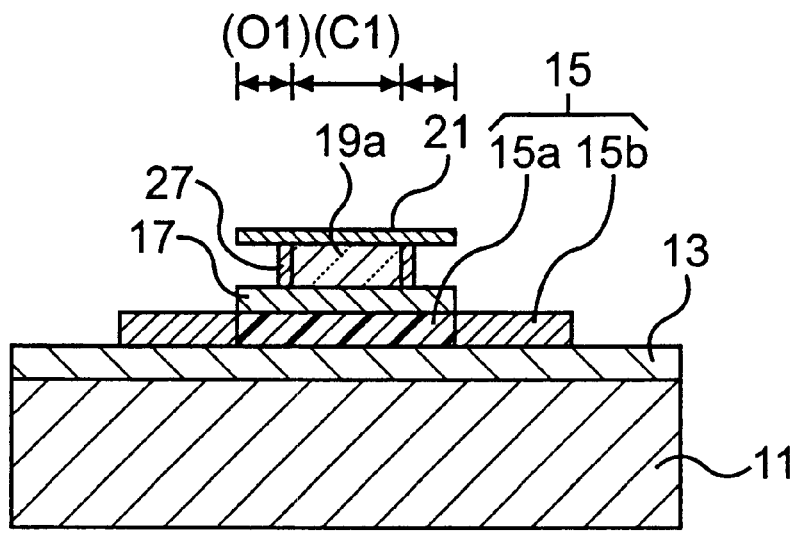
Figure 3:
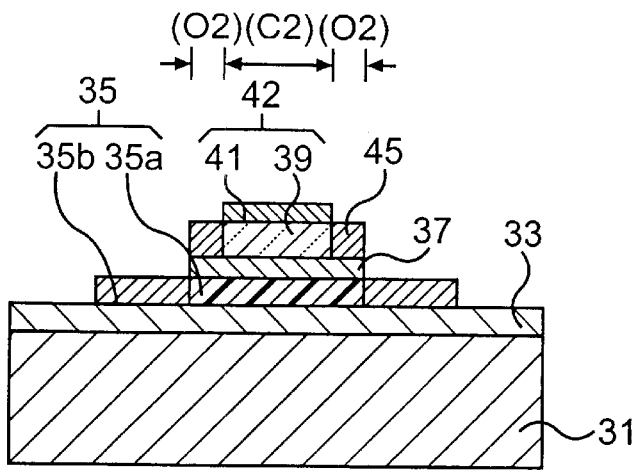
FIG. 3 is a sectional view of a thin film transistor of the present invention.

FIG. 3 shows a sectional view of a TFT according to the present invention. A buffer oxide layer 33 of $SiO_2$ is formed on a transparent insulating layer 31, and a semiconductor layer 35 is formed on a predetermined portion of the buffer oxide layer 33.

The semiconductor layer 35 is formed by depositing polysilicon or amorphous silicon to a thickness between 500 and 1500 Å, and patterning it into a predetermined shape. The semiconductor layer 35 includes of an active region 35$a$ having a channel region C2 and an offset region O2 where impurities are not doped, and an impurity region 35$b$ used for source and drain regions where N type or P type impurities are highly doped. The channel region C2 is positioned at the center of the active region 35$a$. The offset region O2 is formed between the channel region C2 and the impurity region 35$b$.

A gate oxide layer 37 is formed on the active region 35$a$ on the semiconductor layer 35 by depositing $SiO_2$ to a thickness of between 500 and 1500 Å.

A double metal-layered gate 42 comprising first and second gate metal layers 39 and 41 is formed on the gate oxide layer 37 over the channel region C2. A spacer 45 is formed on both sides of the first gate metal layer 39 of the gate over the channel region C2. Here, the first gate metal layer 39 is formed over the channel region C2 by depositing aluminum to a thickness of between 500 and 4000 Å. The spacer 45, formed on both sides of the first gate metal layer 39 through an anodizing process, has a width of between 0.1 and 1 μm. The second gate metal layer 41 is formed on the first gate metal layer 39 by depositing molybdenum to a thickness of between 500 and 2000 Å, and is used as a barrier to the generation of a hillock due to the diffusion of the aluminum of the first gate metal layer 37 to another insulating layer formed on the first gate metal layer 39.

In the TFT above, since the first gate metal layer 39 made of aluminum is surrounded by the second gate metal layer 41 and the spacer 45, the hillock cannot be generated. Also, the offset region O2 is easily defined by the spacer 45.

FIGS. 4A–4D illustrate the manufacturing process of the thin film transistor of FIG. 3.

Figure 4A:
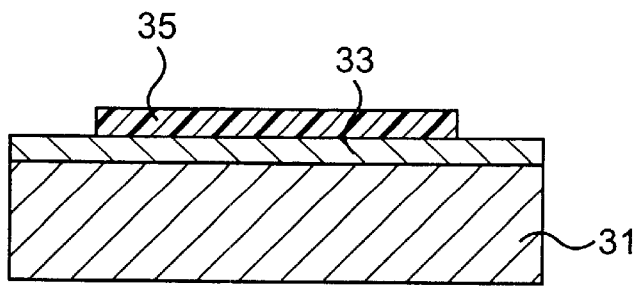
FIGS. 4A–4D illustrate the process steps for the fabrication of the thin film transistor of FIG. 3.

As illustrated in FIG. 4A, the buffer oxide layer 33 and the semiconductor layer 35 are sequentially formed on a transparent insulating substrate 31. Here, the buffer oxide layer 33 is formed by depositing $SiO_2$ by chemical vapor deposition (CVD). The semiconductor layer 35 is formed by depositing polysilicon or amorphous silicon to a thickness of between 500 and 1500 Å and does not contain impurities therein. When forming the semiconductor layer 35 of polysilicon, the polysilicon is deposited by CVD, or formed by depositing amorphous silicon and then annealing by a laser to crystallize the amorphous silicon into polysilicon. The semiconductor layer 35 is patterned by a typical photolithographic process to expose a portion of the buffer oxide layer 33.

Figure 4B:
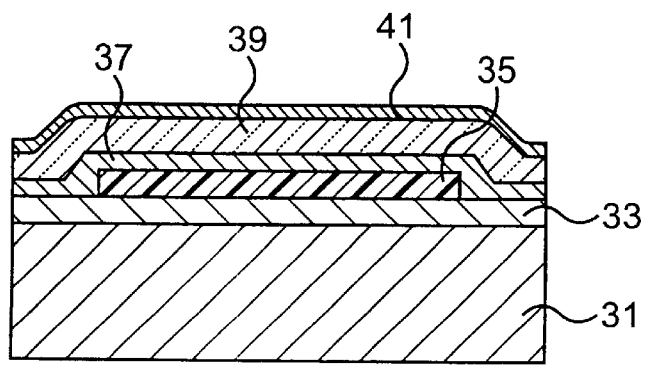

As illustrated in FIG. 4B, the gate oxide layer 37 is formed by depositing $SiO_2$ through CVD to cover the buffer oxide layer 33 and the semiconductor layer 35. Then a first and second gate metal layers 39 and 41 are formed on the gate oxide layer 37 by sequentially depositing aluminum and molybdenum. Here, the first and second gate metal layers 39 and 41 are between 500 and 4000 Å thick and between 500 and 2000 Å thick, respectively.

Figure 4C:
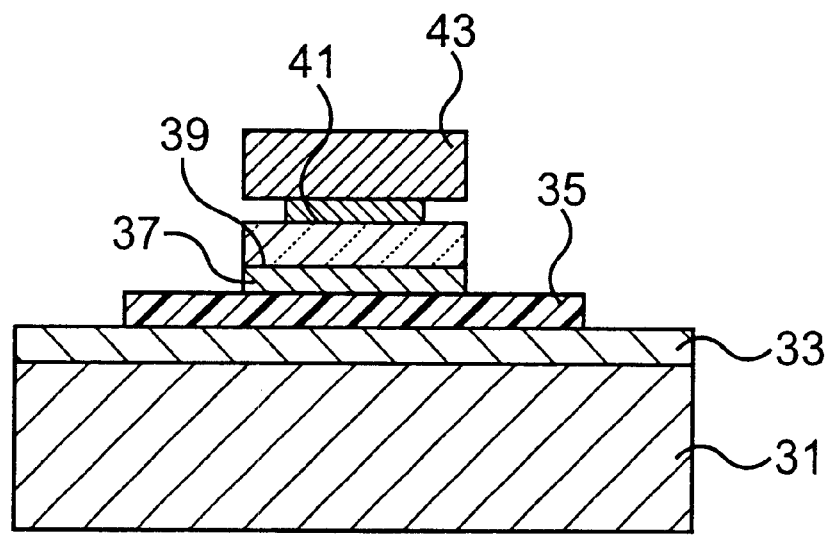

As illustrated in FIG. 4C, a photoresist pattern 43 is formed on the second gate metal layer 41. The second and first gate metal layers 41 and 39 are sequentially etched to expose the gate oxide layer 37, using the photoresist pattern 43 as a mask. The first and second gate metal layers 39 and 41 are etched for between 1 and 3 minutes with an etchant containing the mixture solution of $H_3PO_4$, $CH_3COOH$ and $HNO_3$. Here, the etchant can etch the molybdenum in the second gate metal layer 41 one to ten times faster than the aluminum in the first gate metal layer 39. Therefore, the second gate metal layer 41 is over-etched to expose both sides of the first gate metal layer 39 by 0.1 to 2 µm. The lateral side of the second gate metal layer 41 is etched perpendicularly or at a slope. The gate oxide layer 37 is dry-etched to expose the active layer 35 and the buffer oxide layer 33 using the photoresist pattern 43 as a mask.

Figure 4D:
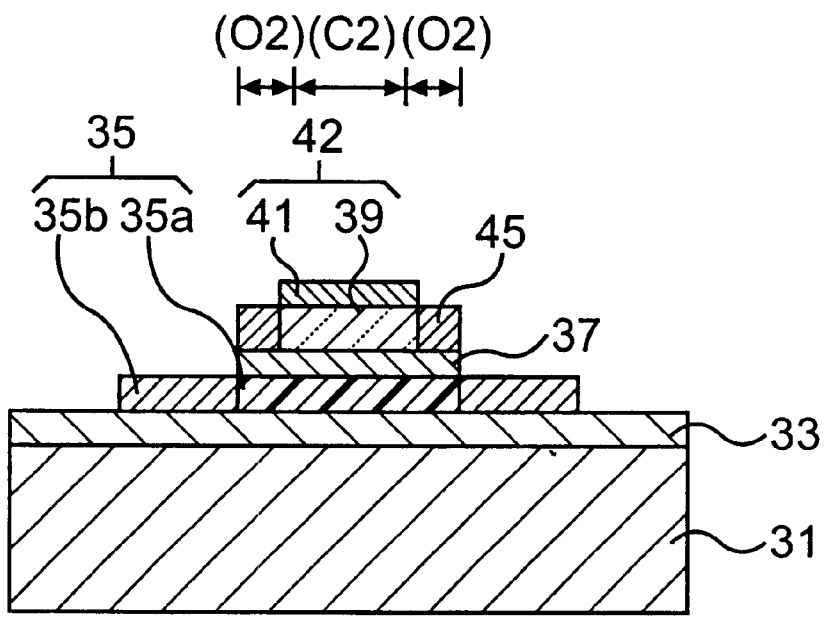

As illustrated in FIG. 4D, the exposed portion of the first gate metal layer 39 is anodized, forming the spacer 45. Here, the remaining first and second gate metal layers 39 and 41 are the double metal-layered gate 42. Thereafter, the photoresist pattern 43 is eliminated. Even though the spacer 45 is formed using the photoresist pattern 43 in the above description, the spacer 45 can also be formed without the photoresist pattern 43.

N type impurities such as phosphorus, or P type impurities such as boron are injected by ion doping to form the high impurity regions 35b used for source and drain regions. The remaining portion of the semiconductor layer 35 is the active region 35a. In the active region 35a, the portion overlapped by the first gate metal layer 39 is the channel region C2 and the portion under the spacer 45 is an offset region O2. Consequently, the offset region O2 is positioned between the impurity region 35b and the channel region C2.

Figure 5A:
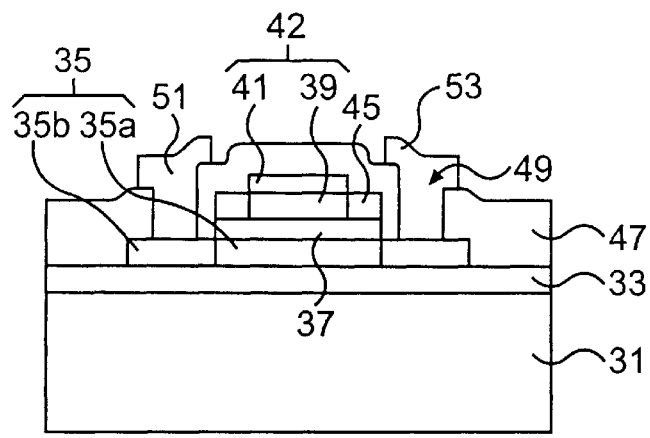
FIGS. 5A–5C illustrate the subsequent process steps performed after the process steps of FIGS. 4A–4D.
Figure 5B:
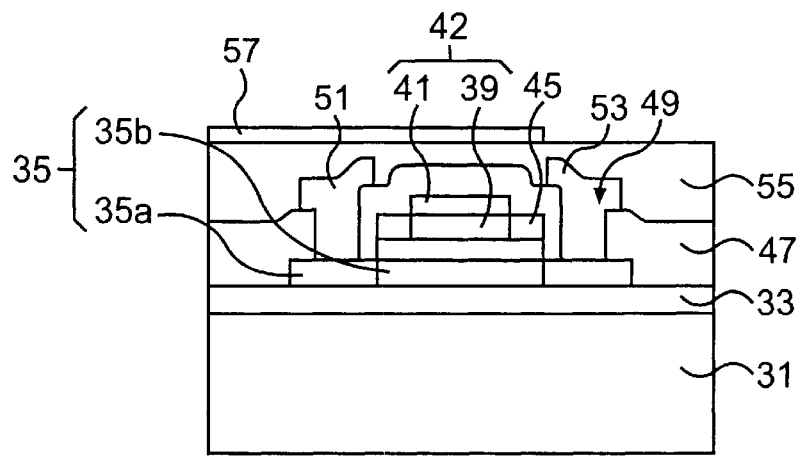
Figure 5C:
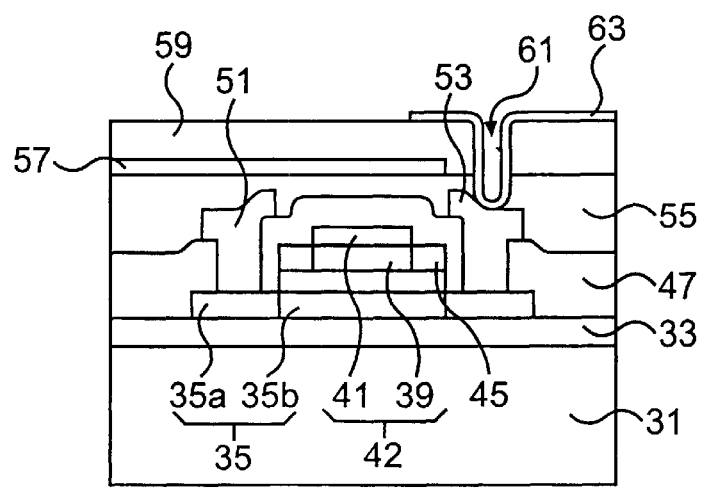

FIGS. 5A–5C illustrate process steps following the steps of FIGS. 4A–4D. As illustrated in FIG. 5A, an insulating interlayer 47 is formed on the resultant structure as shown in FIG. 4D by depositing silicon oxide $SiO_2$ using CVD. A predetermined portion of the insulating interlayer 47 is eliminated by a photolithographic process to form a first contact hole that exposes the impurity region 35b. Conductive metal such as Al, Ti or Cr is deposited and fills up the first contact hole to provide a contact with the impurity region 35b. A deposited conductive metal layer is patterned to form the source and drain electrodes 51 and 53. The impurity regions 35b making contact with the source and drain electrodes 51 and 53 are the source and drain, respectively.

As illustrated in FIG. 5B, a first protective layer 55 is formed on the insulating interlayer 47 and the source and drain electrodes 51 and 53 by depositing an inorganic insulating substance such as $SiO_2$ or $Si_3N_4$, or by coating them with an organic insulating layer including a material having a low dielectric constant, such as BCB (Benzo Cyclo Butene), Polyimide with added Fluorine, PCB (Perfluoro Cyclo Butane), or FPAE (Fluoro Poly Allyl Ether). A light shielding layer 57 is formed on the first protective layer 55 by coating it with an opaque insulating resin, and then exposing and developing the opaque layer. The light shielding layer 57 covers the region excluding the pixel region (not shown).

As illustrated in FIG. 5C, a second protective layer 59 having the same insulating material as the first protective layer 55 is formed on the first protective layer 55 and the light shielding layer 57. Predetermined portions of the first and second protective layers 55 and 59 are eliminated in a photolithographic process to form a second contact hole that exposes the drain electrode 53. A transparent conductive material such as ITO or $SnO_2$ is deposited on the second protective layer 59 by sputtering to form a contact with the drain electrode 53 through the second contact hole. The deposited transparent conductive material is patterned to form a pixel electrode 61 in contact with the drain electrode 53.

As described above, the thin film transistor of the present invention is fabricated as follows. The first gate metal layer 39 of aluminum and the second gate metal layer 41 of molybdenum are sequentially deposited onto the gate oxide layer 37. The first and second gate metal layers 39 and 41 are sequentially etched with an etching solution that etches the second gate metal layer faster than the first gate metal layer 39, using the photoresist pattern 43 as a mask, so that a portion of the first gate metal layer 39 is exposed to a predetermined width. Thereafter, the exposed portion of the first gate metal layer 39 is anode-oxidized to form a spacer 45.

Therefore, the present invention can prevent the generation of the hillock in the first gate metal layer 39 because of the second gate metal layer 41, and the offset region O2 is easily defined by the spacer 45 formed on both sides of the first gate metal layer 39, so that the number of process steps is reduced.

While the invention has been described in detail and with reference to specific embodiments thereof, it will be apparent to one skilled in the art that various changes and modifications can be made therein without departing from the spirit and scope thereof Thus, it is intended that the present invention cover the modifications and variations of this invention provided they come within the scope of the appended claims and their equivalents.

What is claimed is:

1. A method for manufacturing a thin film transistor comprising the steps of forming a semiconductor layer on an insulating substrate, wherein the semiconductor layer has no impurity doping;

sequentially depositing a gate insulating layer, a first gate metal layer and a second gate metal layer on the semiconductor layer;

forming a photoresist pattern on a portion on the second gate metal layer, the photoresist pattern overlapping a portion of the semiconductor layer; and etching the first and second gate metal layers using the photoresist pattern as a mask to expose both sides of the first gate metal layer thereby forming exposed portions of the first gate metal layer, wherein the second gate metal layer is etched faster than the first gate metal layer.

2. The method according to claim 1, wherein the step of depositing the first gate metal layer comprises depositing aluminum.

3. The method according to claim 1, wherein the step of depositing the first gate metal layer provides a thickness of the first gate metal layer between 500 and 4000 Å.

4. The method according to claim 1, wherein the step of depositing the second gate metal layer comprises depositing molybdenum.

5. The method according to claim 1, wherein the step of depositing the second gate metal layer provides a thickness of the second gate metal layer between 500 and 2000 Å.

6. The method according to claim 1, wherein the step of etching the first gate metal layer and the second gate metal layer uses a solution comprising $H_3PO_4$, $CH_3COOH$ and $HNO_3$.

7. The method according to claim 6, wherein the first and second metal layers are etched for between 1 and 3 minutes.

8. The method according to claim 7, wherein the second gate metal layer is over-etched to provide the first gate metal layer with exposed areas having a width in the range of 0.1 through 2 $\mu$m.

9. The method according to claim 1, further comprising the steps of:

anodizing the exposed portions of the first gate metal layer to form a spacer;

removing the photoresist pattern; and forming impurity regions by doping impurities into exposed portions of the semiconductor layer.

10. The method according to claim 9, further comprising the steps of:

forming an insulating interlayer over the gate insulating layer and the semiconductor layer;

removing predetermined portions of the insulating interlayer to form contact holes exposing areas of the impurity regions;

forming source and drain electrodes in contact with the impurity region through the contact holes;

forming a first protective layer on the insulating interlayer and the source and drain electrodes;

forming a light shielding layer covering a portion of the first protective layer excluding a pixel region;

forming a second protective layer on the first insulating layer and the light shielding layer;

removing portions of the first and second protective layers to form another contact hole exposing the drain electrode; and forming a pixel electrode on the second protective layer in contact with the drain electrode through the another contact hole.

11. The method according to claim 10, wherein the first and second protective layers are selected from a group consisting of $SiO_2$, $Si_3N_4$, and BCB.

12. A method of manufacturing a thin film transistor, comprising the steps of:

forming a semiconductor layer on an insulating substrate;

depositing a gate insulating layer, a first gate metal layer and a second gate metal layer on the semiconductor layer;

forming a photoresist pattern on a portion of the second gate metal layer, the photoresist pattern overlapping a predetermined portion of the semiconductor layer;

etching the first and second gate metal layers using the photoresist pattern as a mask to expose both sides of the first gate metal layer thereby forming an exposed portion of the first gate metal layer, wherein the second gate metal layer etches faster than the first gate metal layer;

anodizing the exposed portion of the first gate metal layer to form spacers;

removing the photoresist pattern;

forming impurity regions by doping impurities into exposed portions of the semiconductor layer;

forming an insulating interlayer;

removing selected portions of the insulating interlayer to form contact holes exposing the impurity regions;

forming source and drain electrodes making contact with the impurity regions through the contact holes;

forming a first protective layer on the insulating interlayer and the source and drain electrodes;

forming a light shielding layer covering a portion excluding a pixel region on the first protective layer;

forming a second protective layer on the first insulating layer and light shielding layer;

removing a portion of the first and second protective layers to form another contact hole exposing the drain electrode; and forming a pixel electrode on the second protective layer of the pixel region in contact with the drain electrode through the another contact hole.

* * * * *